United States Patent
Suzuki et al.

(10) Patent No.: US 10,320,150 B2
(45) Date of Patent: Jun. 11, 2019

(54) OPTICAL SEMICONDUCTOR APPARATUS

(71) Applicant: FURUKAWA ELECTRIC CO., LTD., Tokyo (JP)

(72) Inventors: Toshihito Suzuki, Tokyo (JP); Kazuaki Kiyota, Tokyo (JP); Tatsuro Kurobe, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 25 days.

(21) Appl. No.: 15/420,843

(22) Filed: Jan. 31, 2017

(65) Prior Publication Data

US 2017/0141540 A1    May 18, 2017

Related U.S. Application Data

(63) Continuation of application No. PCT/JP2016/074065, filed on Aug. 18, 2016.

(30) Foreign Application Priority Data

Aug. 18, 2015  (JP) ................... 2015-160846

(51) Int. Cl.
*H01S 5/026* (2006.01)
*H01S 5/12* (2006.01)
(Continued)

(52) U.S. Cl.
CPC ......... *H01S 5/1228* (2013.01); *H01S 5/0268* (2013.01); *H01S 5/068* (2013.01);
(Continued)

(58) Field of Classification Search
CPC ........ H01S 5/1228; H01S 5/12; H01S 5/0612; H01S 5/0268; H01S 5/068; H01S 5/0412;
(Continued)

(56) References Cited

U.S. PATENT DOCUMENTS

| | | | | |
|---|---|---|---|---|
| 9,025,958 B1* | 5/2015 | Ketelsen | ................... | G02B 6/34 385/37 |
| 2005/0013330 A1* | 1/2005 | Kish, Jr. | ................ | B82Y 20/00 372/26 |

(Continued)

FOREIGN PATENT DOCUMENTS

| | | |
|---|---|---|
| JP | 9-289348 | 11/1997 |
| JP | 2008-282937 | 11/2008 |

(Continued)

OTHER PUBLICATIONS

International Search Report issued Oct. 25, 2016 in PCT/JP2016/074065 filed on Aug. 18, 2016 (with English Translation of Categories of Cited Documents).

(Continued)

*Primary Examiner* — Yuanda Zhang
(74) *Attorney, Agent, or Firm* — Oblon, McClelland, Maier & Neustadt, L.L.P.

(57) ABSTRACT

An optical semiconductor apparatus includes: semiconductor laser devices having different emission wavelengths and grouped into at least a first group and a second group; and an arrayed waveguide grating connected to the semiconductor laser devices of the first and second groups and configured to combine laser light beams radiating from the semiconductor laser devices into a same point. The arrayed waveguide grating is configured to combine laser light beams from the semiconductor laser devices belonging to the first group into the same point by diffraction in a first diffraction order in the arrayed waveguide grating, and combine laser light beams from the semiconductor laser devices belonging to the second group into the same point by diffraction in a second diffraction order different from the first diffraction order, in the arrayed waveguide grating.

18 Claims, 8 Drawing Sheets

(51) Int. Cl.
*H01S 5/068* (2006.01)
*H01S 5/40* (2006.01)
*H01S 5/06* (2006.01)
*H01S 5/227* (2006.01)
*H01S 5/50* (2006.01)
*H01S 5/022* (2006.01)

(52) U.S. Cl.
CPC .............. *H01S 5/0612* (2013.01); *H01S 5/12* (2013.01); *H01S 5/4012* (2013.01); *H01S 5/4087* (2013.01); *H01S 5/02284* (2013.01); *H01S 5/227* (2013.01); *H01S 5/50* (2013.01)

(58) Field of Classification Search
CPC ...... H01S 5/4087; H01S 5/02284; H01S 5/50; H01S 5/227
See application file for complete search history.

(56) References Cited

U.S. PATENT DOCUMENTS

| | | | |
|---|---|---|---|
| 2013/0121695 | A1 | 5/2013 | Bernasconi et al. |
| 2014/0147129 | A1 | 5/2014 | Brenot et al. |

FOREIGN PATENT DOCUMENTS

| | | |
|---|---|---|
| JP | 2013-542594 | 11/2013 |
| JP | 2014-160136 | 9/2014 |
| JP | 2014-534477 | 12/2014 |
| JP | 2015-138848 | 7/2015 |

OTHER PUBLICATIONS

Written Opinion issued Oct. 25, 2016 in PCT/JP2016/074065 filed on Aug. 18, 2016.

* cited by examiner

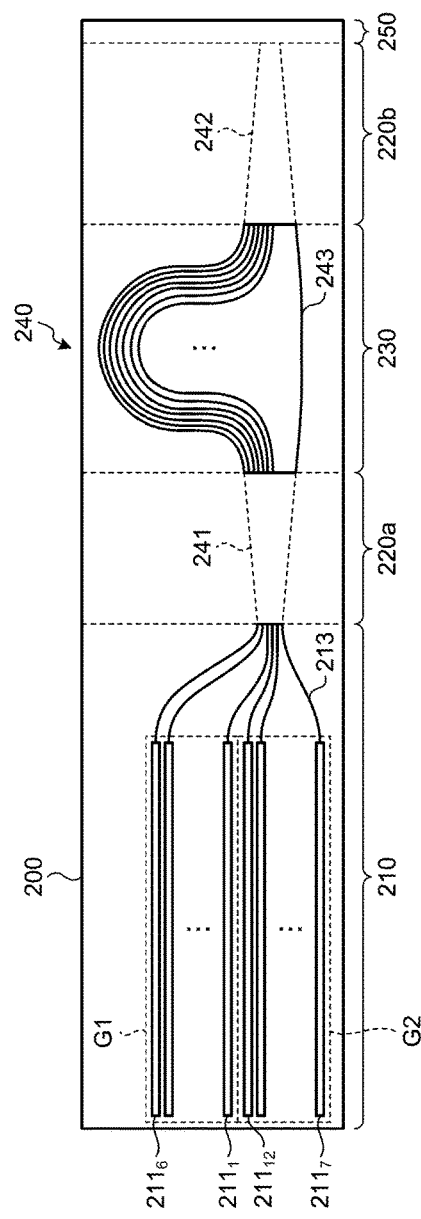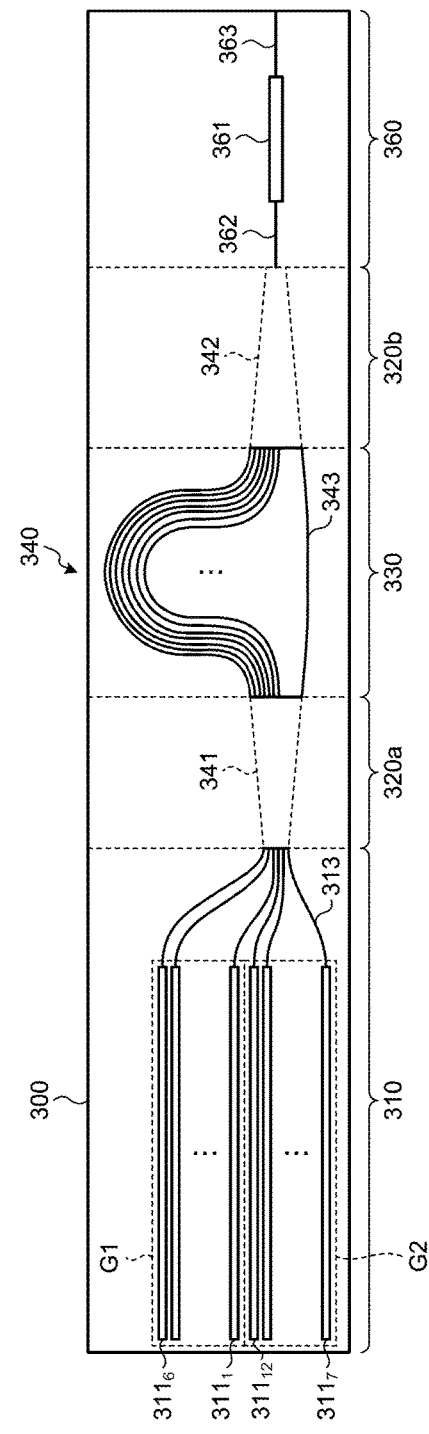

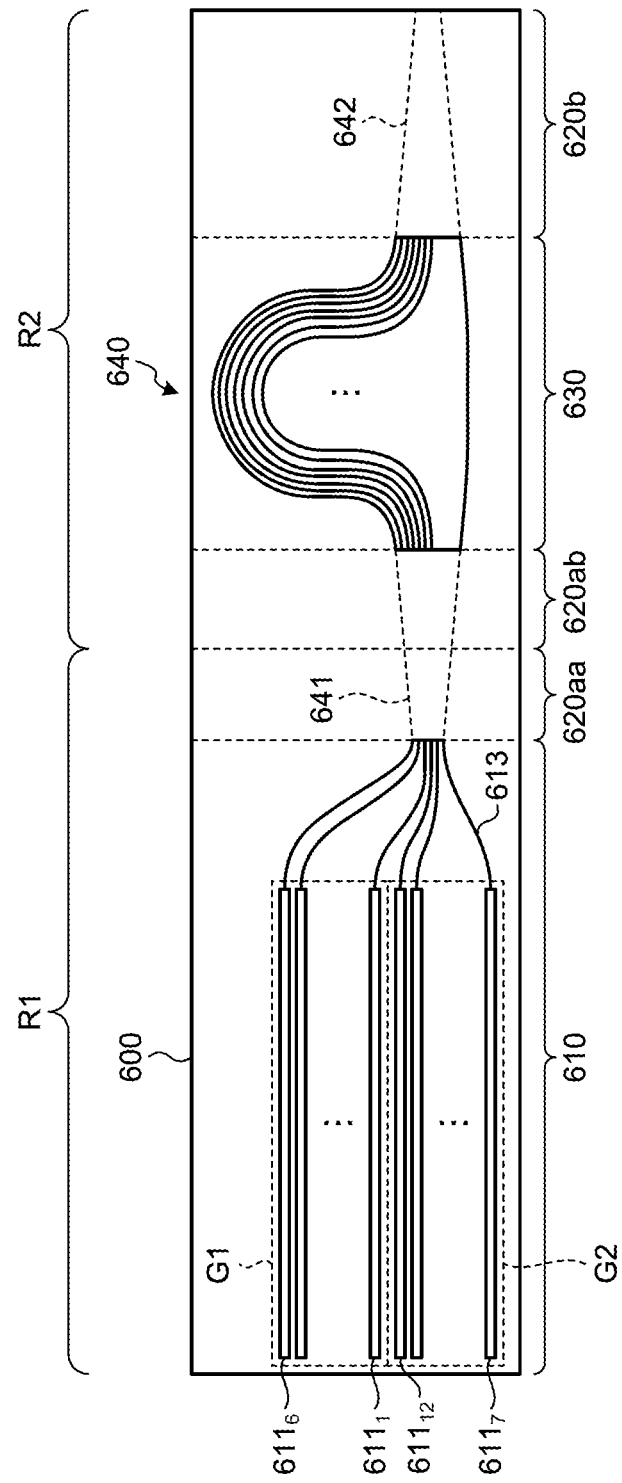

OPTICAL SEMICONDUCTOR APPARATUS

CROSS-REFERENCE TO RELATED APPLICATION(S)

This application is a continuation of International Application No. PCT/JP2016/074065, filed on Aug. 18, 2016 which claims the benefit of priority of the prior Japanese Patent Application No. 2015-160846, filed on Aug. 18, 2015, the entire contents of which are incorporated herein by reference.

BACKGROUND

The present disclosure relates to an optical semiconductor apparatus.

For example, an optical semiconductor apparatus where semiconductor laser devices having different emission wavelengths are integrated is known as a wavelength-tunable light source used for DWDM (Dense Wavelength Division Multiplexing) optical communication and the like. In such an optical semiconductor apparatus where semiconductor laser devices are integrated, generally, an optical coupling unit and the semiconductor laser devices are integrated on the same substrate. The optical coupling unit combines laser light beams output from the semiconductor laser devices. The combined laser light is output from the optical semiconductor apparatus.

At this point in time, suppose that the optical coupling unit integrated in the optical semiconductor apparatus is one without wavelength selectivity such as a multimode interferometer (MMI: Multi Mode Interferometer) optical coupler, the output optical power of the optical semiconductor apparatus with respect to the output optical power of the semiconductor laser devices is equal to or less than a factor of the number of the integrated semiconductor laser devices. Therefore, a loss is high.

Hence, in order to reduce the loss and increase the output efficiency of the device, an optical semiconductor apparatus using an arrayed waveguide grating (AWG: Arrayed Waveguide Grating) as the optical coupling unit is known (see, for example, Japanese Laid-open Patent Publication No. 2008-282937). The AWG includes an input slab waveguide, a waveguide array, and an output slab waveguide. The AWG uses the diffraction phenomenon caused by an optical path difference of the waveguide array to have a similar effect to the diffraction grating.

However, if an AWG and semiconductor laser devices having different wavelengths are combined for use, the loss characteristics of the AWG and the gain characteristics of the semiconductor laser device are multiplied. Accordingly, there is a problem that it is difficult to increase the optical power of laser light at a band edge.

The AWG has a characteristic that the loss (coupling loss) is the lowest at the central wavelength and the loss increases farther away from the central wavelength. On the other hand, the semiconductor laser device is generally designed such that the gain of the active layer is the largest around the central wavelength. Accordingly, the gain decreases farther away from the central wavelength. As a result, there arises a situation where although the gain of the active layer of the semiconductor laser device at the band edge is low, the loss of laser light at the band edge is also high in the AWG. As a result, if an attempt is made to increase the power of the optical semiconductor apparatus, a power limit at the band edge where the disadvantageous conditions result in being linked restricts power over the entire band by the method of the known technology.

SUMMARY

It is an object of the present disclosure to at least partially solve the problems in the conventional technology.

An optical semiconductor apparatus according to one aspect of the present disclosure includes: semiconductor laser devices having different emission wavelengths and grouped into at least a first group and a second group; and an arrayed waveguide grating connected to the semiconductor laser devices of the first and second groups and configured to combine laser light beams radiating from the semiconductor laser devices into a same point. The arrayed waveguide grating is configured to combine laser light beams from the semiconductor laser devices belonging to the first group into the same point by diffraction in a first diffraction order in the arrayed waveguide grating, and combine laser light beams from the semiconductor laser devices belonging to the second group into the same point by diffraction in a second diffraction order different from the first diffraction order, in the arrayed waveguide grating.

An optical semiconductor apparatus according to another aspect of the present disclosure includes: semiconductor laser devices having different emission wavelengths; an arrayed waveguide grating configured to combine laser light beams radiating from the semiconductor laser devices into a same point; and input waveguides configured to guide each of the laser light beams from the semiconductor laser devices to an input facet of an input slab waveguide of the arrayed waveguide grating. There is at least one point where an arrangement order of the input waveguides in a width direction on the input facet is inverted with respect to an order of magnitudes of wavelengths of the laser light beams guided respectively by the input waveguides.

The above and other objects, features, advantages and technical and industrial significance of this disclosure will be better understood by reading the following detailed description of presently preferred embodiments of the disclosure, when considered in connection with the accompanying drawings.

BRIEF DESCRIPTION OF THE DRAWINGS

FIG. 8 is a diagram illustrating an optical semiconductor apparatus according to a second embodiment;

FIG. 9 is a diagram illustrating an optical semiconductor apparatus according to a third embodiment;

FIG. 12 is a diagram illustrating a second modification of the semiconductor optical integrated device.

DETAILED DESCRIPTION

An optical semiconductor apparatus according to embodiments of the present disclosure is described in detail hereinafter with reference to the accompanying drawings. The present disclosure is not limited by the embodiments described below. Moreover, it should be noted that the drawings are schematic, and the dimensional relationship of each component, the ratio of each component, and the like may be different in reality. Portions whose mutual dimensional relationships and ratios are different between the drawings may also be included.

First Embodiment

Figure 1:
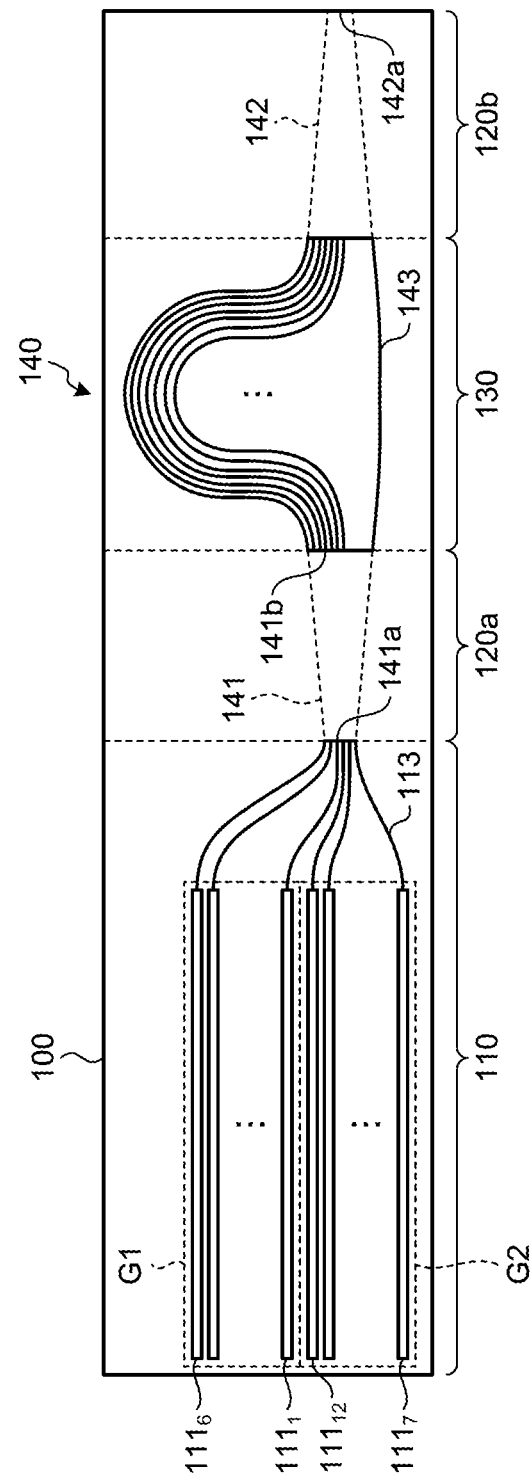
FIG. 1 is a diagram illustrating an optical semiconductor apparatus according to a first embodiment.

FIG. 1 is a diagram illustrating an optical semiconductor apparatus 100 according to a first embodiment. Only a part corresponding to a semiconductor optical integrated device is extracted to describe main portions of the optical semiconductor apparatus 100 illustrated in FIG. 1. Therefore, even if an optical system such as a lens to adjust a ray of light output from the semiconductor optical integrated device, a Peltier device and a thermistor to control the temperature of the semiconductor optical integrated device, and the like are not described in FIG. 1, they may be included in part of the configuration of the optical semiconductor apparatus 100.

As illustrated in FIG. 1, the optical semiconductor apparatus 100 includes a buried waveguide structure region 110 where waveguides are formed by buried waveguides, slab waveguide structure regions 120a and 120b where a waveguide is formed by a slab waveguide, and a high-mesa waveguide structure region 130 where waveguides are formed by high-mesa waveguides.

The buried waveguide structure region 110 includes distributed feed-back (DFB: Distributed Feed-Back) laser devices $111_1$ to $111_{12}$ having different emission wavelengths, and input waveguides 113. The slab waveguide structure region 120a includes an input slab waveguide 141. The slab waveguide structure region 120b includes an output slab waveguide 142. The high-mesa waveguide structure region 130 includes a waveguide array 143. The input slab waveguide 141, the output slab waveguide 142, and the waveguide array 143 form an AWG 140 as one unit. The embodiment is described using the optical semiconductor apparatus 100 with the 12 DFB laser devices $111_1$ to $111_{12}$ having different emission wavelengths. However, the embodiment is not limited by the number of the DFB laser devices.

The DFB laser devices $111_1$ to $111_{12}$ are one mode of the semiconductor laser device. For example, the DFB laser devices $111_1$ to $111_{12}$ are designed such that their emission wavelengths are different by 3.5 nm in a 1.55 μm wavelength bandwidth. The DFB laser devices $111_1$ to $111_{12}$ have a characteristic that a change in temperature brings a change in emission wavelength. In the optical semiconductor apparatus 100, one of the DFB laser devices $111_1$ to $111_{12}$ is selected to make coarse adjustments to the output wavelength, and the temperature is changed to make fine adjustments to the output wavelength. As a result, the optical semiconductor apparatus 100 as a whole operates as a wavelength-tunable light source that emits laser light within a continuous wavelength range.

Moreover, as illustrated in FIG. 1, the DFB laser devices $111_1$ to $111_{12}$ are grouped into a group G1 and a group G2. In terms of the grouping, they are grouped according to the differences in the emission wavelengths of the DFB laser devices $111_1$ to $111_{12}$ as described in detail below. The adjacent DFB laser devices $111_1$ to $111_6$ and the adjacent DFB laser devices $111_7$ to $111_{12}$ are arranged in the same groups such that the emission wavelengths are continuous. However, the emission wavelengths of the DFB laser devices $111_6$ and $111_{12}$ that are adjacent to each other are largely different between the groups G1 and G2. In the embodiment, the configuration where the number of groups is two is illustrated by example. However, also if the number of groups is three or more, adjacent DFB laser devices are similarly arranged in the same groups such that the emission wavelengths are continuous.

Laser light radiating from the DFB laser devices $111_1$ to $111_{12}$ is guided to the input slab waveguide 141 via the input waveguides 113. The input slab waveguide 141 is a waveguide that does not confine light with respect to a direction parallel to a substrate. The input slab waveguide 141 guides the laser light input from the input waveguides 113 to the waveguide array 143 while being diffracted in the direction parallel to the substrate.

The waveguide array 143 includes waveguides formed by bending channels, and is provided with an optical path difference that is dependent on a wavelength. Therefore, if the input position of laser light into the input slab waveguide 141 is changed according to the optical path difference that is dependent on a wavelength, all the wavelengths of the laser light are coupled at the same position at an output end of the output slab waveguide 142.

In the embodiment, laser light radiates directly from an output end 142a of the output slab waveguide 142. The output end 142a also serves as an output end of the optical semiconductor apparatus 100.

Here, a specific configuration example of the AWG 140 according to the embodiment is disclosed.

A group refractive index $n_g$ of the high-mesa waveguide included in the waveguide array 143 is 3.54, and an effective refractive index $n_{eff}$ is 3.19. Moreover, an optical path difference ΔL between adjacent waveguides among the waveguides forming the waveguide array 143 is 16.3 μm. A focal length $L_f$ of the AWG 140 is 480 μm.

Figure 2:
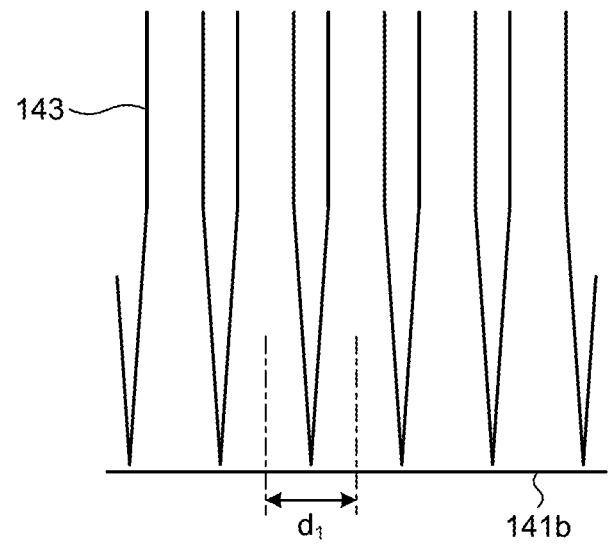
FIG. 2 is an enlarged view of an interface between a waveguide array and an input slab waveguide.
Figure 3:
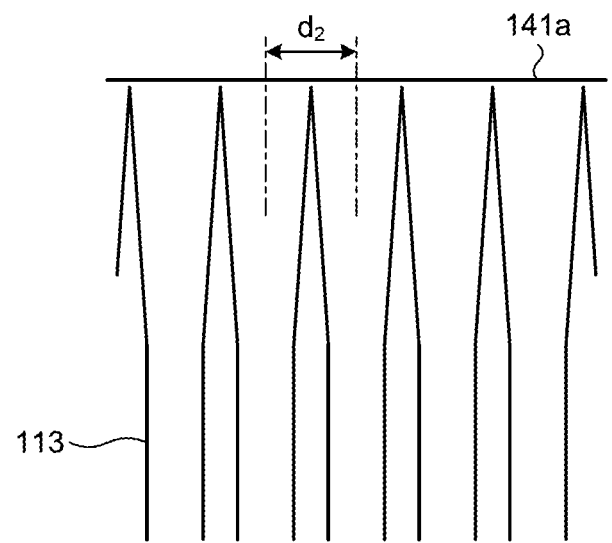
FIG. 3 is an enlarged view of an interface between input waveguides and the input slab waveguide.

A waveguide spacing $d_1$ of the waveguide array 143 on an input facet 141b of the input slab waveguide 141 is 3.5 μm (see FIG. 2). Moreover, a waveguide spacing $d_2$ between the input waveguides 113 on an input facet 141a of the input slab waveguide 141 is 5 μm (see FIG. 3). FIGS. 2 and 3 are enlarged views of the input facets 141b and 141a between the waveguide array 143 and the input waveguides 113, and the input slab waveguide 141. As illustrated in FIGS. 2 and 3, each of the waveguide array 143 and the input waveguides 113 is tapered in the waveguide width at connection portions of the input facets 141b and 141a of the input slab waveguide 141. The waveguide array 143 and the input waveguide 113 are designed to have a large opening for the input facets 141b and 141a of the input slab waveguide 141.

Figure 4:
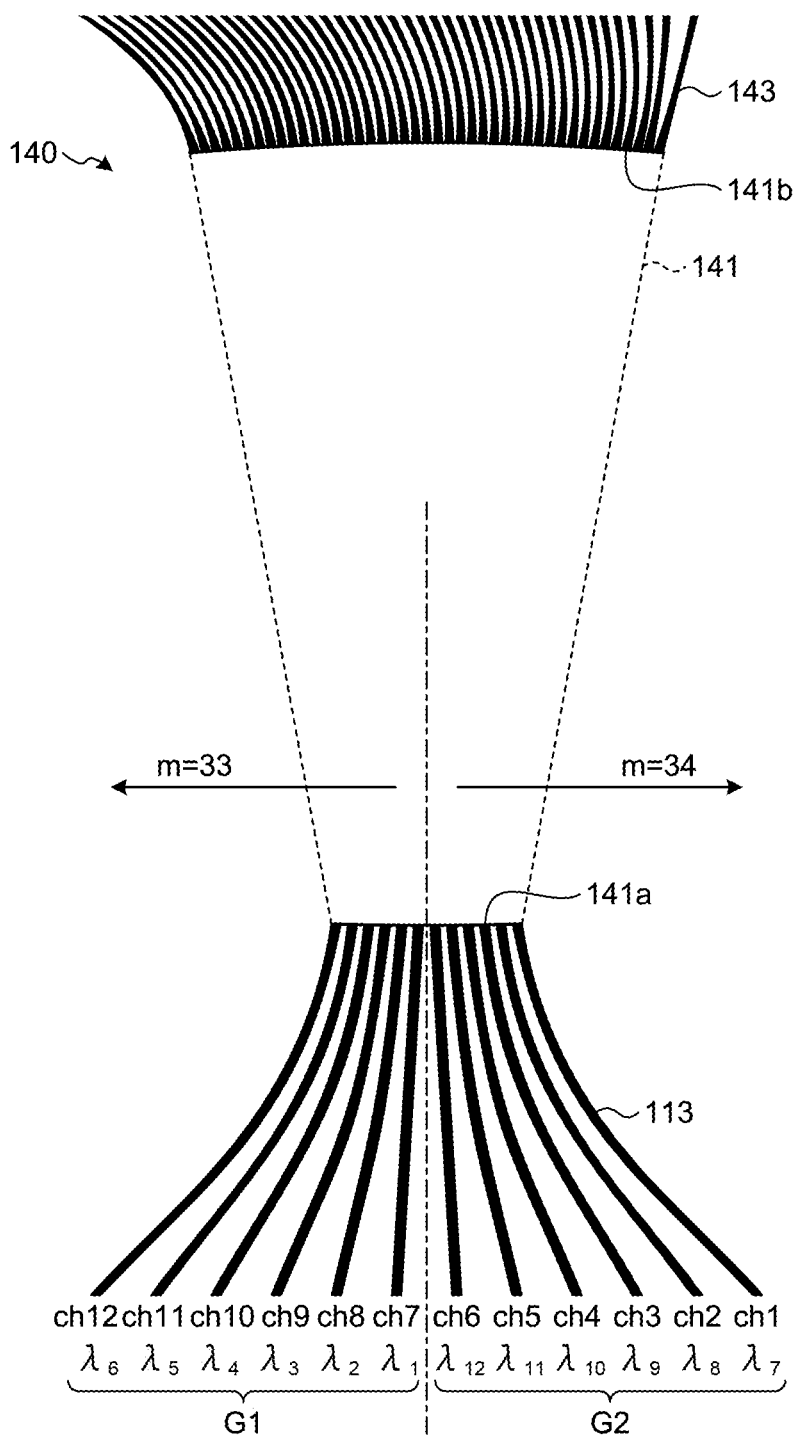
FIG. 4 is a diagram illustrating the arrangement order of the input waveguides that guide laser light from DFB laser devices to the input slab waveguide.

FIG. 4 is a diagram illustrating the order of arrangement of the input waveguides 113 that guide laser light from the DFB laser devices $111_1$ to $111_{12}$ to the input slab waveguide 141. As illustrated in FIG. 4, in this configuration example, the number of the input waveguides 113 that guide laser light to the input slab waveguide 141 is 12 from ch1 to ch12. The channel numbers, ch1 to ch12, of the input waveguides 113 are assigned in order of arrangement with respect to the width direction (the wavelength resolution direction of the AWG 140) of the input facet 141a of the input slab waveguide 141. Moreover, the input waveguides 113 of ch1 to ch6 are connected to the DFB laser devices $111_7$ to $111_{12}$ that belong to the group G2. The input waveguides 113 of ch7 to ch12 are connected to the DFB laser devices $111_1$ to $111_6$ that belong to the group G1.

As illustrated in FIG. 4, the input waveguides 113 of ch1 to ch6 are connected respectively to the DFB laser devices $111_7$ to $111_{12}$ whose emission wavelengths are $\lambda_7$ to $\lambda_{12}$. Moreover, the input waveguides 113 of ch7 to ch12 are connected respectively to the DFB laser devices $111_1$ to $111_6$ whose emission wavelengths are $\lambda_1$ to $\lambda_6$. To put it another way, the DFB laser devices $111_1$ to $111_6$ whose emission wavelengths are $\lambda_1$ to $\lambda_6$ belong to the group G1. The DFB laser devices $111_7$ to $111_{12}$ whose emission wavelengths are $\lambda_7$ to $\lambda_{12}$ belong to the group G2.

Here, the emission wavelengths $\lambda_1$ to $\lambda_{12}$ are arranged in order of wavelengths from long to short. In other words, the emission wavelengths $\lambda_1$ to $\lambda_{12}$ satisfy the following relationship:

$$\lambda_1 \lambda_3 \lambda_4 \lambda_5 \lambda_7 \lambda_8 \lambda_9 \lambda_{10} \lambda_{11}$$

A wavelength interval $\Delta\lambda$ between the emission wavelengths is substantially equal to 3.5 nm. Specifically, $\lambda_{i-1} - \lambda_i \approx 3.5$ nm (i=2, ..., 12). However, as described above, the DFB laser devices $111_1$ to $111_{12}$ have the characteristic that a change in the temperature of the device causes the emission wavelength to change. Accordingly, the wavelength interval between the emission wavelengths here is assumed to indicate the wavelength interval at the same temperature. As described above, when the wavelength interval $\Delta\lambda$ is set to be substantially equal to 3.5 nm, and a wavelength bandwidth with a central wavelength of 1.55 μm is configured by the 12 DFB laser devices $111_1$ to $111_{12}$, it results in a tunable wavelength bandwidth of 1.53 μm to 1.57 μm.

As illustrated in FIG. 4, in the input waveguides of ch7 to ch12 assigned to the emission wavelengths $\lambda_1$ to $\lambda_6$ that belong to the group G1, the order of arrangement with respect to the width direction of the input facet 141a agrees with the order of arrangement of the emission wavelengths of the connected DFB laser devices $111_1$ to $111_6$. Similarly, in the input waveguides of ch1 to ch6 assigned to the emission wavelengths $\lambda_7$ to $\lambda_{12}$ that belong to the group G2, the order of arrangement with respect to the width direction of the input facet 141a agrees with the order of arrangement of the emission wavelengths of the connected DFB laser devices $111_7$ to $111_{12}$.

On the other hand, as illustrated in FIG. 4, the input waveguide of ch7 assigned to the longest wavelength $\lambda_1$ is adjacent to the input waveguide of ch6 assigned to the shortest wavelength $\lambda_{12}$ between the groups G1 and G2. In other words, the physical arrangement order and the order of arrangement of emission wavelengths change their places between the input waveguide of ch7 and the input waveguide of ch6. To put it another way, there is at least one point where the order of arrangement of input waveguides in the width direction of the input facet is inverted with respect to the order of magnitudes of wavelengths of laser light guided by the input waveguides. In JP-A-2008-282937, the physical arrangement order agrees with the order of arrangement of emission wavelengths in the input waveguides over the entire wavelength bandwidth in the AWG. Accordingly, the arrangement order for the AWG 140 of this configuration is characteristic.

As described above, the reason why the AWG 140 has the point where the physical arrangement order of input waveguides and the order of arrangement of emission wavelengths assigned to the input waveguides change their places is that the AWG 140 uses diffraction phenomena of different orders. Specifically, in the AWG 140, the input waveguides of ch7 to ch12 that belong to the group G1 combine the emission wavelengths $\lambda_1$ to $\lambda_6$ of laser light, using a diffraction phenomenon where an diffraction order m is 33. The input waveguides of ch1 to ch6 that belong to the group G2 combine the emission wavelengths $\lambda_7$ to $\lambda_{12}$ of laser light, using a diffraction phenomenon where the diffraction order m is 34. The emission wavelength bandwidth of laser light corresponding to the group G1 is substantially equal to half the FSR for the diffraction order m=33. The emission wavelength bandwidth of laser light corresponding to the group G2 is substantially equal to half the FSR for the diffraction order m=34. Here, the free spectral range (FSR: Free Spectral Range) of the AWG is the largest wavelength bandwidth for a given order that does not overlap the same range in an adjacent order.

The reason why the input waveguide of ch7 assigned to the longest wavelength $\lambda_1$ is adjacent to the input waveguide of ch6 assigned to the shortest wavelength $\lambda_{12}$ is that the input waveguide of ch7 is the longest wave end in the diffraction order m=33, and the input waveguide of ch6 is the shortest wave end in the diffraction order m=34. To put it another way, there is a boundary between the diffraction order m=33 and the diffraction order m=34, between the input waveguide of ch7 assigned to the longest wavelength $\lambda_1$ and the input waveguide of ch6 assigned to the shortest wavelength $\lambda_{12}$.

As in the above description, the FSR of the AWG 140 is substantially equal to a tunable wavelength bandwidth configured by the 12 DFB laser devices $111_1$ to $111_{12}$. The FSR of the AWG 140 is not necessarily required to completely agree with the bandwidth configured by the DFB laser devices $111_1$ to $111_{12}$. The difference between the FSR of the AWG 140 and the bandwidth configured by the DFB laser devices $111_1$ to $111_{12}$ may be adjusted by the waveguide spacing between the input waveguide of ch6 and the input waveguide of ch7. In other words, as described above, the waveguide spacing $d_2$ between input waveguides of channels is 5 μm. However, the waveguide spacing between the input waveguide of ch6 and the input waveguide of ch7 is changed from 5 μm to enable absorption of the difference between the FSR of the AWG 140 and the bandwidth configured by the DFB laser devices $111_1$ to $111_{12}$.

Here, a description is given of a design guideline of the AWG to achieve the above configuration.

A central wavelength $\lambda_c$ of the AWG 140 is determined according to the arrangement of the emission wavelengths of the DFB laser devices $111_1$ to $111_{12}$. The central wavelength $\lambda_c$ typically selects the shortest or longest wavelength in the bandwidth configured by the DFB laser devices $111_1$ to $111_{12}$. As described above, this is because the gains of the active layers of DFB laser devices $111_1$ to $111_{12}$ are often designed to be the largest around the central wavelength in the bandwidth; therefore, the gain decreases farther away from the central wavelength. In order to suppress the wavelength dependence of the DFB laser devices $111_1$ to $111_{12}$ by cancelling out the wavelength characteristic of the gain of the active layer and wavelength characteristic of the AWG 140, it is preferable to set the central wavelength $\lambda_c$ of the AWG 140 at the shortest or longest wavelength in the bandwidth configured by the DFB laser devices $111_1$ to $111_{12}$.

The central wavelength $\lambda_c$ of the AWG 140 is not limited to the above example, but may also be set at one other than the shortest or longest wavelength in the bandwidth configured by the DFB laser devices $111_1$ to $111_{12}$. From the viewpoint of improving a minimum value of the optical power among the DFB semiconductor laser devices $111_1$ to $111_{12}$, it is preferable to set the central wavelength $\lambda_c$ of the AWG 140 at the emission wavelength of a DFB semiconductor laser device $111_i$ (i=1 to 12) having the minimum value. Moreover, also if an attempt is made to improve not the minimum value but the average, there may arise a case where a setting at one other than the shortest or longest wavelength in the bandwidth configured by the DFB laser devices $111_1$ to $111_{12}$ is optimum. Accordingly, the central wavelength $\lambda_c$ of the AWG 140 is a parameter that is required to be altered by design as appropriate.

Next, the diffraction order m in which the FSR of the AWG 140 is substantially equal to the bandwidth configured by the DFB laser devices $111_1$ to $111_{12}$ is selected using the following equation (1). In other words, the diffraction order m in which substantially the same wavelength range as a bandwidth FSR that is determined by required specifications and should be configured by the DFB laser devices $111_1$ to $111_{12}$ is calculated by the following equation (1).

$$FSR = \frac{n_{\mathit{eff}} \lambda_c}{n_g m} \quad (1)$$

Next, the diffraction order m required by the equation (1), and the central wavelength $\lambda_c$ are used to determine the optical path difference $\Delta L$ between adjacent waveguides in the AWG 140 with the following equation (2).

$$\Delta L = \frac{m \lambda_c}{n_{\mathit{eff}}} \quad (2)$$

Furthermore, the focal length $L_f$ of the AWG 140 is determined with the following equation (3) such that the waveguide spacing $d_2$ on the input facet 141a of the input slab waveguide 141 is waveguide resolution that matches the wavelength interval $\Delta \lambda$. $n_s$ in the following equation (3) is the effective refractive index of the input slab waveguide.

$$L_f = \frac{\Delta \lambda}{d_2} \frac{n_s n_{\mathit{eff}} d_1}{m n_g} \quad (3)$$

Figure 5:
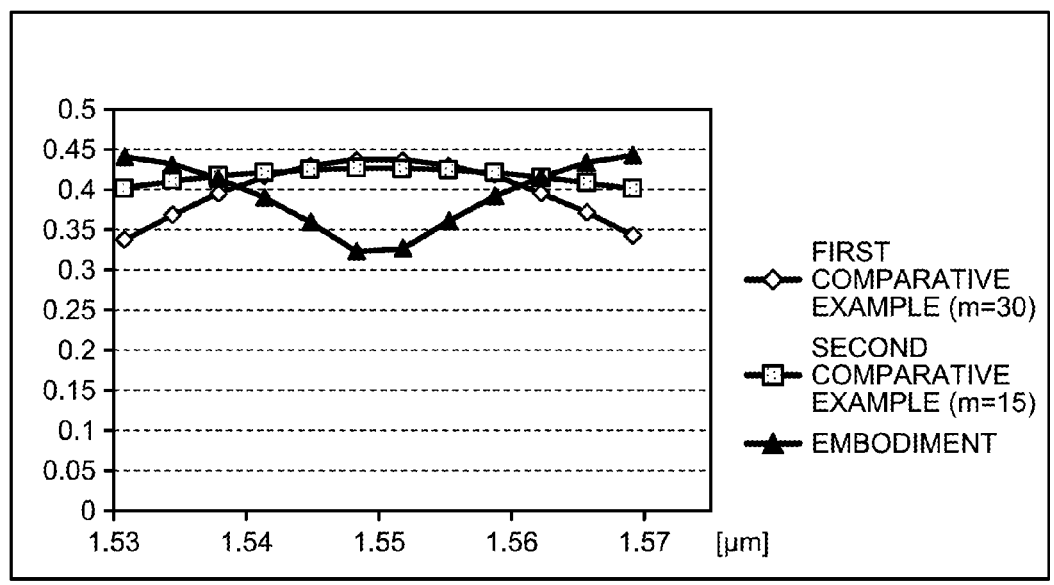
FIG. 5 is a diagram illustrating a graph of the wavelength dependence of an AWG alone.
Figure 6:
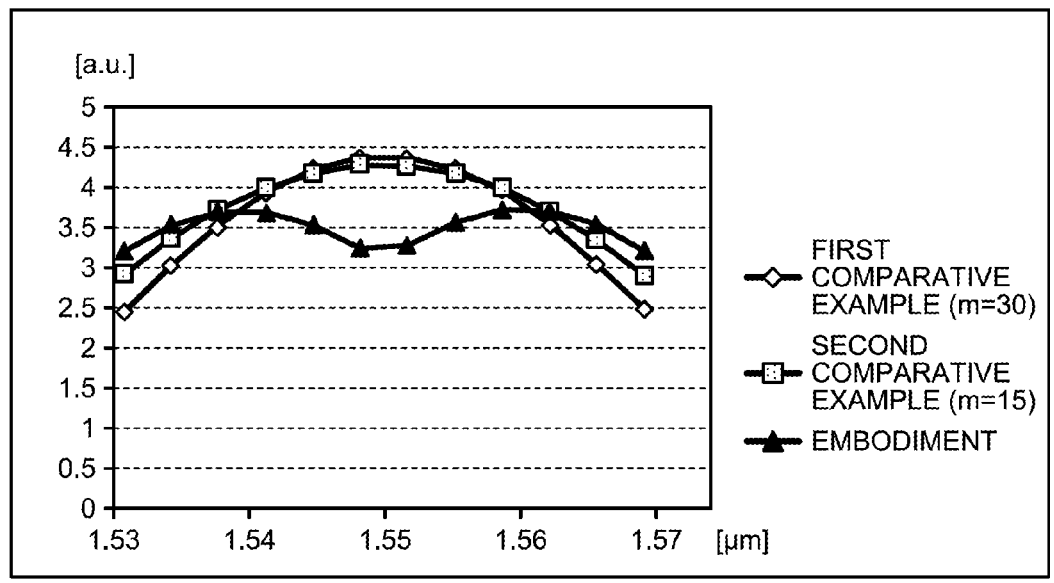
FIG. 6 is a diagram illustrating a graph of results obtained by compensating the wavelength dependence in an integrated device.

Here, a description is given of an effect of the compensation of the optical power of when the AWG 140 and the DFB laser devices $111_1$ to $111_{12}$ of the embodiment are integrated. FIG. 5 is a diagram illustrating a graph of wavelength dependence of transmittance of the AWG alone. FIG. 6 is a diagram illustrating a graph of results where the wavelength dependence is compensated within the integrated device.

Both of FIGS. 5 and 6 describe comparisons between the embodiment, a first comparative example, and a second comparative example. In FIGS. 5 and 6, the embodiment is an example where the above-described AWG 140 is used. The first comparative example is an example where a known AWG of the diffraction order m=30 is used. The second comparative example is an example where a known AWG of the diffraction order m=15. The horizontal axes of FIGS. 5 and 6 describe the wavelength in the 1.55 μm wavelength bandwidth. The vertical axis of FIG. 5 represents the coupling efficiency of the AWG alone. The vertical axis of FIG. 6 is an arbitrary unit (a.u.) representing the output optical power.

As in the graph illustrated in FIG. 5, the wavelength characteristic of the AWGs of the comparative examples is upward convex. The loss at the central wavelength (1.55 μm) in the tunable wavelength bandwidth is the lowest. The loss increases farther away from the central wavelength. Moreover, as in the comparison between the first and second comparative examples, as the diffraction order increases, the tendency is more noticeable.

On the other hand, the focal length $L_f$ of the AWG 140 obtained from the equation (3) is inversely proportional to the diffraction order m. Accordingly, the size of the AWG 140 of the second comparative example is increased as compared to the first comparative example. Hence, it is preferable that the diffraction order be high in the viewpoint of the performance of mass production, a reduction in the size of the optical semiconductor apparatus, and an increase in packing density.

On the other hand, in terms of the AWG 140 of the embodiment, the wavelength characteristic is downward convex. The loss at the central wavelength (1.55 μm) in the tunable wavelength bandwidth is the largest. The loss decreases farther away from the central wavelength. As described above, this is because in the AWG 140 of the embodiment, the shortest and longest wavelengths in the 1.55 μm wavelength bandwidth are the central wavelength of the AWG 140. Moreover, the central wavelength (1.55 μm) in the tunable wavelength bandwidth is located at both ends of the input facet 141a in order of arrangement with respect to the width direction of the input facet 141a of the input slab waveguide 141 even at the center on the wavelength axis of the graph.

FIG. 6 illustrates results of the combinations of the wavelength characteristic of the AWGs illustrated in FIG. 5 and another wavelength dependence within the integrated device. Here, the wavelength dependence of the gain of the active layer of the DFB laser device is assumed. However, the results illustrated in FIG. 6 are examples. The wavelength dependence varies largely depending on the design of the DFB laser device. Moreover, the results illustrated in FIG. 6 are wavelength dependence of the gain of the active layer of the DFB laser device. However, also if a semiconductor optical amplifier (SOA: Semiconductor Optical Amplifier) described below is integrated together with the AWG, similar effects may be obtained.

As illustrated in FIG. 6, in the first and second comparative examples, the wavelength characteristic of the AWG and the wavelength dependence of the gain of the active layer are multiplied. The wavelength dependence of the integrated device as a whole is increased. Specifically, the magnitude of the optical power is large around the central wavelength, but the optical power decreases farther away from the central wavelength. This indicates that if an attempt is made to increase the optical power as the optical integrated device, optical power around 1.53 μm and 1.57 μm restricts the performance as a product.

On the other hand, in the AWG 140 of the embodiment, the loss of the wavelength dependence of the AWG 140 alone at the central wavelength is the largest, and the loss decreases farther away from the central wavelength. Accordingly, the wavelength dependence of the AWG 140 alone and the wavelength dependence of the gain of the active layer of the DFB laser device cancel each other out. The difference between the minimum value and the maximum value of the optical power is reduced. As a result, if an attempt is made to increase the optical power as the semiconductor optical integrated device, a high optical power as the product is obtained by the amount of the improvement of the minimum value. This may also be considered as the achievement of a reduction in power consumption by the amount of the improvement of the minimum value.

Figure 7:
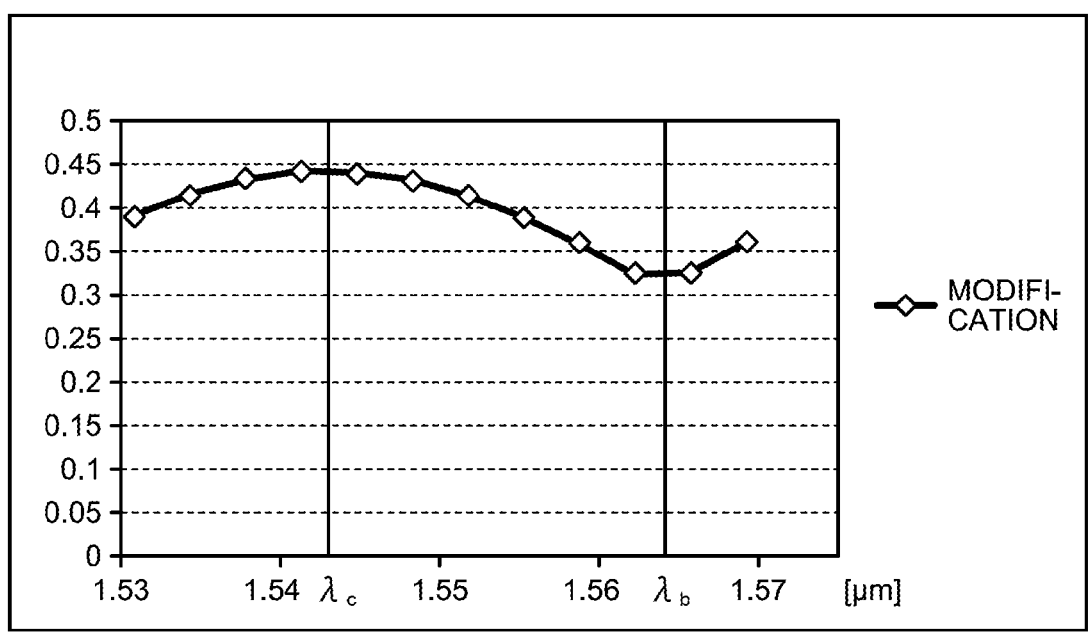
FIG. 7 is a diagram illustrating a graph of the wavelength dependence of the AWG of a modification of the embodiment.

FIG. 7 is a diagram illustrating a graph of the wavelength dependence of the AWG of a modification of the embodiment. The horizontal axis of FIG. 7 describes the wavelength in the 1.55 µm wavelength bandwidth µm. The vertical axis of FIG. 7 represents the coupling efficiency of the AWG. As already described, the central wavelength $\lambda_c$ of the AWG may also be set at one other than the shortest or longest wavelength in the bandwidth configured by the DFB laser devices. This is because, from the viewpoint of improving the minimum value of the gain of the active layer in the DFB laser devices $111_1$ to $111_{12}$, the emission wavelength of the DFB laser device $111_i$ (i=1 to 12) having the minimum value is preferable to be set for the central wavelength $\lambda_c$ of the AWG. The example of the wavelength dependence of the AWG illustrated in FIG. 7 is an example where the central wavelength $\lambda_c$ of the AWG is set around a wavelength of 1.543 µm, and a wavelength $\lambda_b$ at both ends of the arrangement of the input waveguides on the slab waveguide facet is placed around a wavelength of 1.564 µm. If the AWG of the wavelength dependence illustrated in FIG. 7 is combined with the DFB laser device array whose minimum value of the gain of the active layer is around the wavelength of 1.543 µm, the wavelength dependence is cancelled out to improve the minimum value of the optical power.

In this manner, when the AWG 140 of the embodiment is applied to an actual semiconductor optical integrated device, the position of the central wavelength $\lambda_c$ of the AWG is selected such that the wavelength dependence decreases, according to the wavelength dependence obtained by design of a laser device and an SOA.

As described above, the optical semiconductor apparatus 100 according to the first embodiment is configured such that: the semiconductor laser devices $111_1$ to $111_{12}$ are grouped into the first group G1 and the second group G2; Laser light beams from the semiconductor laser devices $111_1$ to $111_6$ that belong to the first group G1 are combined into the same point by diffraction in a first diffraction order in the AWG 140; and Laser light beams from the semiconductor laser devices $111_7$ to $111_{12}$ that belong to the second group G2 are combined into the same point by diffraction in a second diffraction order different from the first diffraction order, in the AWG 140. Accordingly, the wavelength dependence of the AWG 140 and the wavelength dependence of the active layers of the DFB laser devices $111_1$ to $111_{12}$ may cancel each other out. The wavelength dependence of the optical power of the optical semiconductor apparatus 100 may be reduced.

Second Embodiment

FIG. 8 is a diagram illustrating an optical semiconductor apparatus 200 according to a second embodiment. Only a part corresponding to a semiconductor optical integrated device is extracted to describe main portions of the optical semiconductor apparatus 200 illustrated in FIG. 8 as in the optical semiconductor apparatus 100 of the first embodiment. Moreover, the optical semiconductor apparatus 200 according to the second embodiment has a similar configuration to that of the optical semiconductor apparatus 100 of the first embodiment. Therefore, a description of the details is assumed to be omitted as appropriate.

As illustrated in FIG. 8, the optical semiconductor apparatus 200 includes a buried waveguide structure region 210 where waveguides are formed by buried waveguides, slab waveguide structure regions 220a and 220b where a waveguide is formed by a slab waveguide, a high-mesa waveguide structure region 230 where waveguides are formed by high-mesa waveguides, and a window structure region 250 without a waveguide structure.

The buried waveguide structure region 210 includes DFB laser devices $211_1$ to $211_{12}$ having different emission wavelengths, and input waveguides 213. The slab waveguide structure region 220a includes an input slab waveguide 241. The slab waveguide structure region 220b includes an output slab waveguide 242. The high-mesa waveguide structure region 230 includes a waveguide array 243. The input slab waveguide 241, the output slab waveguide 242, and the waveguide array 243 form an AWG 240 as one unit. The window structure region 250 is formed between the output slab waveguide 242 and an emission end. Laser light radiates from the output slab waveguide 242 via the window structure region 250. Accordingly, it is possible to suppress return light due to edge reflection and also reduce the astigmatic difference of the laser light that radiates. The embodiment is described here using the optical semiconductor apparatus 200 with the 12 DFB laser devices $211_1$ to $211_{12}$ having different emission wavelengths. However, the embodiment is not limited by the number of the DFB laser devices.

The DFB laser devices $211_1$ to $211_{12}$ are configured to be able to function as a wavelength-tunable light source in a wavelength bandwidth having a central wavelength of, for example, 1.55 µm as in the first embodiment. Moreover, as in the first embodiment, the DFB laser devices $211_1$ to $211_{12}$ are grouped into a group G1 and a group G2. In terms of the grouping, as in the first embodiment, the adjacent DFB laser devices $211_1$ to $211_6$ and the adjacent DFB laser devices $211_7$ to $211_{12}$ are arranged in the same groups such that the emission wavelengths are continuous. However, among the emission wavelengths of the DFB laser devices $211_1$ to $211_{12}$, the DFB laser device $211_1$ of the shortest wavelength and the DFB laser device $211_{12}$ of the longest wavelength are adjacent across the groups G1 and G2.

Laser light radiating from the DFB laser devices $211_1$ to $211_{12}$ is guided to the AWG 240 via the input waveguides 213. A specific configuration of the AWG 240 may be made similar to, for example, that of the AWG 140 of the first embodiment.

The optical semiconductor apparatus 200 with the above configuration according to the second embodiment is also configured such that: the semiconductor laser devices $211_1$ to $211_{12}$ are grouped into the first group G1 and the second group G2; Laser light beams from the semiconductor laser devices $211_1$ to $211_6$ that belong to the first group G1 are combined into the same point by diffraction in a first diffraction order in the AWG 240; and Laser light beams from the semiconductor laser devices $211_7$ to $211_{12}$ that belong to the second group G2 are combined into the same point by diffraction in a second diffraction order different from the first diffraction order, in the AWG 240. Accordingly, the wavelength dependence of the AWG 240 and the wavelength dependence of the active layers of the DFB laser devices $211_1$ to $211_{12}$ may cancel each other out. The wavelength dependence of the optical power of the optical semiconductor apparatus 200 may be reduced.

Third Embodiment

FIG. 9 is a diagram illustrating an optical semiconductor apparatus 300 according to a third embodiment. Only a part corresponding to a semiconductor optical integrated device is extracted to describe main portions of the optical semiconductor apparatus 300 illustrated in FIG. 9 as in the optical semiconductor apparatus 100 of the first embodiment. Moreover, the optical semiconductor apparatus 300 according to the third embodiment has a similar configuration to that of the optical semiconductor apparatus 100 of the first embodiment. Therefore, a description of the details is assumed to be omitted as appropriate.

As illustrated in FIG. 9, the optical semiconductor apparatus 300 includes buried waveguide structure regions 310 and 360 where waveguides are formed by buried waveguides, slab waveguide structure regions 320a and 320b where a waveguide is formed by a slab waveguide, and a high-mesa waveguide structure region 330 where waveguides are formed by high-mesa waveguides.

The buried waveguide structure region 310 includes DFB laser devices $311_1$ to $311_{12}$ having different emission wavelengths, and input waveguides 313. The slab waveguide structure region 320a includes an input slab waveguide 341. The slab waveguide structure region 320b includes an output slab waveguide 342. The high-mesa waveguide structure region 330 includes a waveguide array 343. The input slab waveguide 341, the output slab waveguide 342, and the waveguide array 343 form an AWG 340 as one unit. The buried waveguide structure region 360 includes an SOA 361 and output waveguides 362 and 363. The embodiment is described using the optical semiconductor apparatus 300 with the 12 DFB laser devices $311_1$ to $311_{12}$ having different emission wavelengths. However, the embodiment is not limited by the number of the DFB laser devices.

The DFB laser devices $311_1$ to $311_{12}$ are configured to be able to function as a wavelength-tunable light source in a wavelength bandwidth having a central wavelength of, for example, 1.55 μm as in the first embodiment. Moreover, as in the first embodiment, the DFB laser devices $311_1$ to $311_{12}$ are grouped into a group G1 and a group G2. In terms of the grouping, as in the first embodiment, the adjacent DFB laser devices $311_1$ to $311_6$ and the adjacent DFB laser devices $311_7$ to $311_{12}$ are arranged in the same groups such that the emission wavelengths are continuous. However, among the emission wavelengths of the DFB laser devices $311_1$ to $311_{12}$, the DFB laser device $311_1$ of the shortest wavelength and the DFB laser device $311_{12}$ of the longest wavelength are adjacent across the groups G1 and G2.

Laser light radiating from the DFB laser devices $311_1$ to $311_{12}$ is guided to the AWG 340 via the input waveguides 313. A specific configuration of the AWG 340 may be made similar to, for example, that of the AWG 140 of the first embodiment.

Laser light output from the output slab waveguide 342 of the AWG 340 is guided to the SOA 361 by the output waveguide 362. The SOA 361 amplifies laser light input from the output waveguide 362. The output waveguide 363 is a waveguide for guiding the laser light amplified by the SOA 361 to the outside of the optical semiconductor apparatus 300.

As illustrated in FIG. 9, the optical semiconductor apparatus 300 according to the third embodiment is configured such that the DFB laser devices $311_1$ to $311_{12}$ and the SOA 361 are on the same semiconductor optical integrated device. In such a case, from the viewpoint of manufacture, the active layers of the DFB laser devices $311_1$ to $311_{12}$ are often of the same kind as the active layer of the SOA 361. Therefore, the wavelength dependence of the active layers of the DFB laser devices $311_1$ to $311_{12}$ and the wavelength dependence of the active layer of the SOA 361 result in being of the same kind. In other words, a wavelength providing a minimum value of gain in the DFB laser devices $311_1$ to $311_{12}$ results in agreeing with a wavelength providing a minimum value of gain of the SOA 361. Accordingly, a synergistic effect of wavelength dependence works strongly.

In the optical semiconductor apparatus 300 according to the third embodiment, the wavelength dependence of the AWG 340 and the wavelength dependence of the active layers of the DFB laser devices $311_1$ to $311_{12}$ and the SOA 361 may cancel each other out. Accordingly, even if the synergistic effect of the wavelength dependence works strongly due to the DFB laser devices $311_1$ to $311_{12}$ and the SOA 361, the wavelength dependence of the optical semiconductor apparatus 300 as a whole may be suppressed. If the kinds of the active layers of the DFB laser devices $311_1$ to $311_{12}$ and the active layer of the SOA 361 are made the same, the degree of flexibility in design is reduced. However, in the optical semiconductor apparatus 300 according to the third embodiment, flexibility in design is produced in the wavelength dependence of the AWG 340. Accordingly, flexibility in the suppression of the wavelength dependence may be ensured as the optical semiconductor apparatus 300 as a whole.

Moreover, generally, the wavelength dependence of the SOA 361 is larger than the wavelength dependence of the DFB laser devices $311_1$ to $311_{12}$. Hence, it is efficient for design to set the central wavelength of the AWG 340 at a wavelength providing a minimum value of the gain of the SOA.

Fourth Embodiment

Figure 10:
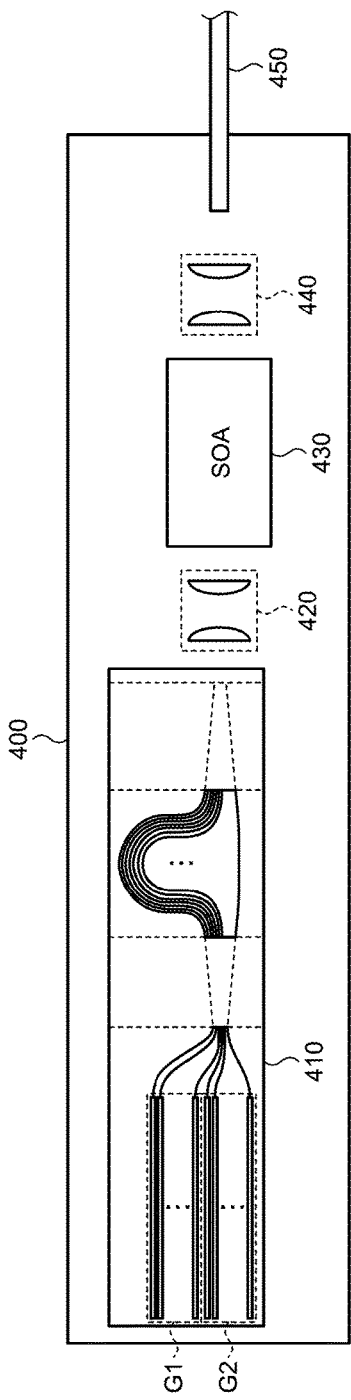
FIG. 10 is a diagram illustrating an optical semiconductor apparatus according to a fourth embodiment.

FIG. 10 is a diagram illustrating an optical semiconductor apparatus 400 according to a fourth embodiment. The optical semiconductor apparatus 400 according to the fourth embodiment has a configuration including an SOA, but has a configuration including an SOA being a separate body from a semiconductor optical integrated device unlike the optical semiconductor apparatus 300 according to the third embodiment.

As illustrated in FIG. 10, the optical semiconductor apparatus 400 according to the fourth embodiment includes a semiconductor optical integrated device 410, a first optical system 420, an SOA 430, a second optical system 440, and an optical fiber 450.

The semiconductor optical integrated device 410 may have substantially the same configuration as that of the optical semiconductor apparatus 200 according to the second embodiment. Therefore, DFB laser devices included in the semiconductor optical integrated device 410 are grouped into a group G1 and a group G2. In terms of the grouping, adjacent DFB laser devices are arranged in the same groups such that the emission wavelengths are continuous. However, among the emission wavelengths of the DFB laser devices, the DFB laser device of the shortest wavelength and the DFB laser device of the longest wavelength are adjacent across the groups G1 and G2. In addition, the semiconductor optical integrated device 410 also includes an AWG, but has substantially the same configuration as that of the second embodiment. Therefore, its description is omitted here.

The first optical system 420 is an optical system for coupling laser light radiating from the semiconductor optical integrated device 410 in space to the SOA 430. The first optical system 420 includes, for example, two collimator lenses, and collimates the laser light radiating from the semiconductor optical integrated device 410 at a predetermined NA (numerical aperture). The predetermined NA of the collimated light is converted into NA appropriate for the SOA 430. The laser light is caused to enter the SOA 430. In the fourth embodiment, when the laser light radiating from the semiconductor optical integrated device 410 is coupled to the SOA 430, the optical system for spatial coupling is used. However, butt coupling of the semiconductor optical integrated device 410 and the SOA 430 may be used, or waveguides for coupling of a PLC, a Si waveguide, or the like may be used.

The SOA 430 is a semiconductor optical amplifying device for amplifying the input laser light. The SOA 430 is a semiconductor optical amplifying device that is independent of the semiconductor optical integrated device 410. Accordingly, its degree of flexibility in selection is high. If the wavelength bandwidth of the laser light radiating from the semiconductor optical integrated device 410 may be amplified, any semiconductor optical amplifying device may be adopted as the SOA 430 of the embodiment.

The second optical system 440 is an optical system for coupling laser light radiating from the SOA 430 in space to the optical fiber 450. The second optical system 440 includes, for example, two collimator lenses, and collimates the laser light radiating from the SOA 430 at a predetermined NA. The predetermined NA of the collimated light is converted into NA appropriate for the optical fiber 450. The laser light is caused to enter the optical fiber.

The optical semiconductor apparatus 400 with the above configuration may select the SOA 430 separately from the DFB laser devices integrated in the semiconductor optical integrated device 410. In other words, the degree of flexibility in design for cancelling the wavelength dependence is high. Therefore, not only the cancellation of the wavelength dependence of the active layers of the DFB laser devices and the wavelength dependence of the AWG but also the cancellation effect of the wavelength dependence may be improved by the design of the SOA 430. As a result, the optical semiconductor apparatus 400 according to the fourth embodiment may not only, for example, improve the minimum value, but also make more advanced adjustments by, for example, a reduction in wavelength dependence over the entire wavelength bandwidth.

Moreover, also in the embodiment, as in the third embodiment, efficient design is to set the central wavelength of the AWG at a wavelength providing a minimum value of gain of the SOA 430.

MODIFICATIONS

Modifications of the semiconductor optical integrated device are described here. The modifications of the semiconductor optical integrated device, described below, may also be applied to the first to fourth embodiments of the optical semiconductor apparatus after being altered, as appropriate. However, modifications of the first embodiment of the semiconductor optical integrated device are described here as a representative.

Figure 11:
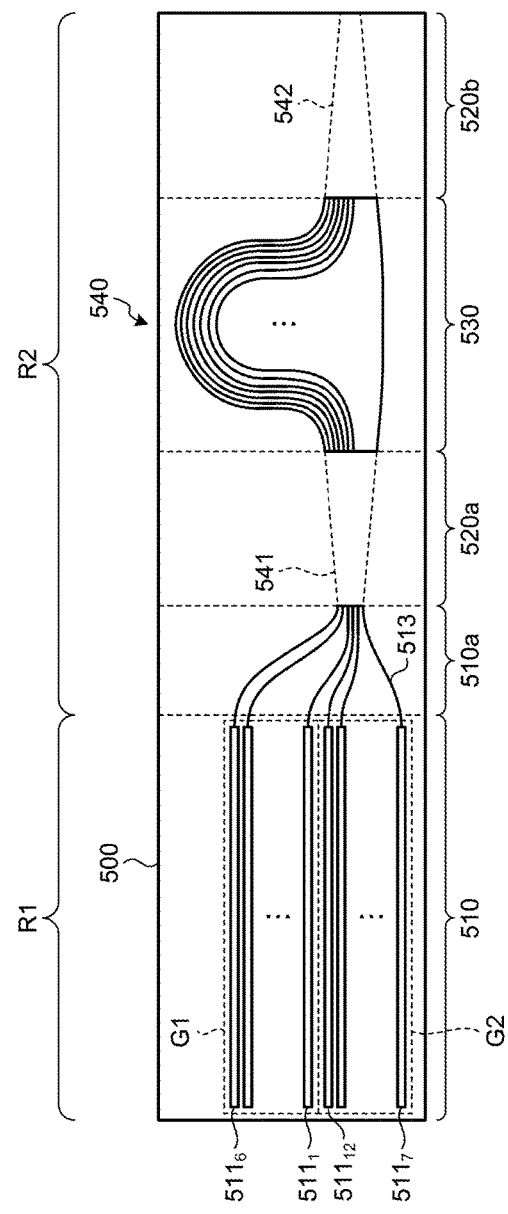
FIG. 11 is a diagram illustrating a first modification of a semiconductor optical integrated device.

FIG. 11 is a diagram illustrating a first modification of the semiconductor optical integrated device. Only a part corresponding to a semiconductor optical integrated device 500 illustrated in FIG. 11 is extracted to describe main portions of an optical semiconductor apparatus. Moreover, a description of the already described details of the semiconductor optical integrated device 500 is assumed to be omitted as appropriate.

As illustrated in FIG. 11, the semiconductor optical integrated device 500 includes a DFB laser region 510, an input waveguide region 510a, slab waveguide structure regions 520a and 520b where a waveguide is formed by a slab waveguide, and a waveguide array region 530.

However, in the semiconductor optical integrated device 500, part of the input waveguide region 510a, the slab waveguide structure regions 520a and 520b, and the waveguide array region 530 include what is called silicon wire waveguides. Parts of the DFB laser region 510 and the input waveguide region 510a include waveguides made of an InP-based semiconductor material. In other words, the semiconductor optical integrated device 500 according to the first modification is a hybrid semiconductor optical integrated device including a region R2 having silicon wire waveguides and a region R1 having waveguides made of another material.

Here, the silicon wire waveguide indicates an optical waveguide configured to include a core made of silicon (Si) and clads with a lower refractive index than that of the core, confine light in the core, and guide the light.

The DFB laser region 510 is made of the InP-based semiconductor material, and includes DFB laser devices $511_1$ to $511_{12}$ having different emission wavelengths. The DFB laser devices $511_1$ to $511_{12}$ are configured to be able to function as a wavelength-tunable light source in a wavelength bandwidth having a central wavelength of, for example, 1.55 μm as in the first embodiment. Moreover, as in the first embodiment, the DFB laser devices $511_1$ to $511_{12}$ are grouped into a group G1 and a group G2. In terms of the grouping, as in the first embodiment, the adjacent DFB laser devices $511_1$ to $511_6$ and the adjacent DFB laser devices $511_7$ to $511_{12}$ are arranged in the same groups such that the emission wavelengths are continuous. However, among the emission wavelengths of the DFB laser devices $511_1$ to $511_{12}$, the DFB laser device $511_1$ of the shortest wavelength and the DFB laser device $511_{12}$ of the longest wavelength are adjacent across the groups G1 and G2.

On the other hand, the slab waveguide structure regions 520a and 520b, and the waveguide array region 530 are made of the silicon-based semiconductor material. The slab waveguide structure regions 520a and 520b, and the waveguide array region 530 include an input slab waveguide 541, an output slab waveguide 542, and an AWG 540, respectively. The functions of these configurations are similar to those of the first embodiment.

Input waveguides 513 are formed on both of the InP- and silicon-based regions. The input waveguide 513 including a silicon wire waveguide is optically connected to the input waveguide 513 made of the InP material across the regions R1 and R2.

The semiconductor optical integrated device 500 with the above configuration may also cause the wavelength dependence of the AWG 540 and the wavelength dependence of the active layers of the DFB laser devices $511_1$ to $511_{12}$ to cancel each other out, and may reduce the wavelength dependence of optical power of the semiconductor optical integrated device 500.

FIG. 12 is a diagram illustrating a second modification of the semiconductor optical integrated device. Only a part corresponding to a semiconductor optical integrated device 600 illustrated in FIG. 12 is extracted to describe main portions of an optical semiconductor apparatus. Moreover, a description of the already described details of the semiconductor optical integrated device 600 is assumed to be omitted as appropriate.

As illustrated in FIG. 12, the semiconductor optical integrated device 600 includes a DFB laser region 610, slab waveguide structure regions 620aa, 620ab, and 620b where a waveguide is formed by a slab waveguide, and a waveguide array region 630.

However, in the semiconductor optical integrated device 600, the slab waveguide structure region 620ab and 620b, and the waveguide array region 630 include what is called silicon wire waveguides. The DFB laser region 610 and the slab waveguide structure region 620aa include waveguides made of an InP-based semiconductor material. In other words, the semiconductor optical integrated device 600 according to the second modification is also a hybrid semiconductor optical integrated device including a region R2 having the silicon wire waveguides and a region R1 having the waveguides made of another material, as in the first modification.

The DFB laser region 610 is formed of the InP-based semiconductor material, and includes DFB laser devices $611_1$ to $611_{12}$ having different emission wavelengths, and input waveguides 613. The DFB laser devices $611_1$ to $611_{12}$ are configured to be able to function as a wavelength-tunable light source in a wavelength bandwidth having a central wavelength of, for example, 1.55 µm as in the first embodiment. Moreover, as in the first embodiment, the DFB laser devices $611_1$ to $611_1$, are grouped into a group G1 and a group G2. In terms of the grouping, as in the first embodiment, the adjacent DFB laser devices $611_1$ to $611_6$ and the adjacent DFB laser devices $611_7$ to $611_{12}$ are arranged in the same groups such that the emission wavelengths are continuous. However, among the emission wavelengths of the DFB laser devices $611_1$ to $611_{12}$, the DFB laser device $611_1$ of the shortest wavelength and the DFB laser device $611_{12}$ of the longest wavelength are adjacent across the groups G1 and G2. Moreover, the slab waveguide structure region 620aa is also made of an InP-based semiconductor material, and includes part of an input slab waveguide 641.

On the other hand, the slab waveguide structure regions 620ab and 620b and the waveguide array region 630 are made of the silicon-based semiconductor material. The slab waveguide structure regions 620ab and 620b and the waveguide array region 630 include part of an input slab waveguide 641, an output slab waveguide 642, and an AWG 640, respectively. The functions of these configurations are similar to those of the first embodiment.

The semiconductor optical integrated device 600 with the above configuration may also cause the wavelength dependence of the AWG 640 and the wavelength dependence of the active layers of the DFB laser devices $611_1$ to $611_{12}$ to cancel each other out, and may reduce the wavelength dependence of the optical power of the semiconductor optical integrated device 600.

The optical semiconductor apparatus according to the present disclosure has an effect that the wavelength dependence of optical power may be suppressed.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An optical semiconductor apparatus comprising:
semiconductor laser devices having different emission wavelengths and grouped into at least a first group and a second group; and
an arrayed waveguide grating connected to the semiconductor laser devices of the first and second groups and configured to combine laser light beams radiating from the semiconductor laser devices into a same point, the arrayed waveguide grating being configured to:
  (i) combine laser light beams from the semiconductor laser devices belonging to the first group into the same point by diffraction in a first diffraction order in the arrayed waveguide grating, and
  (ii) combine laser light beams from the semiconductor laser devices belonging to the second group into the same point by diffraction in a second diffraction order different from the first diffraction order, in the arrayed waveguide grating, wherein
a first laser light beam having a longest wavelength and a second laser light beam having a shortest wavelength among the laser light beams radiating from the semiconductor laser devices are incident onto a portion of the arrayed waveguide grating, the portion excluding edge portions of the arrayed waveguide grating in a width direction of an input facet of the arrayed waveguide grating.

2. The optical semiconductor apparatus according to claim 1, wherein
the arrayed waveguide grating includes an input slab waveguide,
each of the laser light beams from the semiconductor laser devices belonging to the first group is guided to an input facet of the input slab waveguide through a first input waveguide group,
each of the laser light beams from the semiconductor laser devices belonging to the second group is guided to the input facet of the input slab waveguide through a second input waveguide group, and
input waveguides belonging to the first and second input waveguide groups are arranged in order of wavelengths of laser light beams guided respectively by the input waveguides on the input facet in the groups.

3. The optical semiconductor apparatus according to claim 2, wherein
the first and second input waveguide groups are arranged side by side on the input facet of the input slab waveguide, and
two input waveguides belonging respectively to the groups are arranged across a boundary in an opposite order to an order of wavelengths of the input waveguides.

4. The optical semiconductor apparatus according to claim 1, wherein the arrayed waveguide grating is configured such that a loss until the laser light beams of the semiconductor laser devices are combined into the same point is lower at edges than a center side of a wavelength bandwidth configured by the laser light beams.

5. The optical semiconductor apparatus according to claim 1, wherein a range between the longest and shortest wavelengths among emission wavelengths of the semiconductor laser devices is substantially same as a free spectral range of the arrayed waveguide grating.

6. The optical semiconductor apparatus according to claim 1, wherein a point different from an order of emission wavelengths of the semiconductor laser devices is set to reduce a difference in output optical power over an entire emission wavelength bandwidth.

7. The optical semiconductor apparatus according to claim 1, wherein the semiconductor laser devices and the arrayed waveguide grating are integrated in a same semiconductor optical integrated device.

8. The optical semiconductor apparatus according to claim 7, further comprising input waveguides provided between the arrayed waveguide grating and the semiconductor laser devices of the first and second groups such that the arrayed waveguide grating is connected to the semiconductor laser devices of the first and second groups, wherein in the semiconductor optical integrated device, the semiconductor laser devices, the input waveguides, and the arrayed waveguide grating are integrated on a same substrate.

9. The optical semiconductor apparatus according to claim 7, wherein the semiconductor laser devices and the arrayed waveguide grating are formed on different substrates, and are optically connected via the input waveguides to be integrated in the semiconductor optical integrated device.

10. The optical semiconductor apparatus according to claim 7, wherein an optical waveguide functional device is further integrated in the semiconductor optical integrated device.

11. The optical semiconductor apparatus according to claim 7, further comprising an optical waveguide functional device to which the laser light radiating from the semiconductor optical integrated device is coupled.

12. The optical semiconductor apparatus according to claim 10, wherein the optical waveguide functional device includes a semiconductor optical amplifier.

13. The optical semiconductor apparatus according to claim 12, wherein a central wavelength of the arrayed waveguide grating is substantially equal to a wavelength providing a minimum value of gain of the semiconductor optical amplifier among the emission wavelengths of the semiconductor laser array.

14. The optical semiconductor apparatus according to claim 1, wherein the optical semiconductor apparatus is a wavelength-tunable laser light source.

15. An optical semiconductor apparatus comprising:

semiconductor laser devices having different emission wavelengths;

an arrayed waveguide grating configured to receive laser light beams radiating from the semiconductor laser devices from an input facet of an input slab waveguide of the arrayed waveguide grating, and to output the laser light beams from a same point on an output facet of an output slab waveguide of the arrayed waveguide grating; and input waveguides configured to guide corresponding ones of the laser light beams from the semiconductor laser devices to the input facet of the input slab waveguide of the arrayed waveguide grating, wherein there is at least one point where an arrangement order of the input waveguides in a width direction on the input facet is inverted with respect to an order of magnitudes of wavelengths of the laser light beams guided respectively by the input waveguides.

16. The optical semiconductor apparatus according to claim 15, wherein at least some of the laser light beams radiating from the semiconductor laser devices are combined by using diffraction phenomena in different diffraction orders in the arrayed waveguide grating.

17. The optical semiconductor apparatus according to claim 15, wherein among the input waveguides, the input waveguides that guide laser light of the shortest wavelength and the longest wavelength are adjacent on the input facet of the input slab waveguide.

18. The optical semiconductor apparatus according to claim 17, wherein among the emission wavelengths of the semiconductor laser devices, the shortest and longest wavelengths are substantially equal to central wavelengths of free spectral ranges corresponding to adjacent diffraction orders in the arrayed waveguide grating.

* * * * *